United States Patent [19]

Yamazaki

[11] Patent Number: 5,330,616
[45] Date of Patent: Jul. 19, 1994

[54] ELECTRIC DEVICE PROVIDED WITH CARBON PATTERN STRUCTURE AND MANUFACTURING METHOD FOR THE SAME

[75] Inventor: Shunpei Yamazaki, Tokyo, Japan

[73] Assignee: Semiconductor Energy Laboratory Co., Ltd., Kanagawa, Japan

[21] Appl. No.: 965,434

[22] Filed: Oct. 23, 1992

Related U.S. Application Data

[60] Division of Ser. No. 631,758, Dec. 21, 1990, abandoned, which is a continuation of Ser. No. 301,136, Jan. 25, 1989, abandoned.

[51] Int. Cl.⁵ .............................................. H01L 21/00
[52] U.S. Cl. ................................. 156/643; 156/646; 156/655; 156/659.1; 437/228; 204/192.35
[58] Field of Search ................ 156/643, 646, 659.1, 156/655; 437/228; 204/192.35

[56] References Cited

U.S. PATENT DOCUMENTS

| | | |
|---|---|---|
| 4,254,426 | 0/1981 | Pankove . |
| 4,650,922 | 3/1987 | McPherson ............................ 174/52 |
| 4,722,913 | 2/1988 | Miller ........................................ 357/2 |
| 4,804,490 | 2/1989 | Pryor ........................................ 357/2 |
| 4,845,533 | 7/1989 | Pryor et al. ............................. 357/2 |
| 4,869,755 | 9/1989 | Nuschka ................................. 357/72 |
| 4,972,250 | 11/1990 | Omori et al. ......................... 357/54 |

FOREIGN PATENT DOCUMENTS

| | | |
|---|---|---|
| 0221531 | of 1987 | European Pat. Off. . |
| 55-107270 | 8/1980 | Japan . |
| 58-145134 | 8/1983 | Japan . |
| 60-145375 | 7/1985 | Japan . |
| 204933 | 9/1986 | Japan . |
| 61-244068 | 10/1986 | Japan . |
| 63-015461 | 1/1988 | Japan . |

OTHER PUBLICATIONS

R.C.A. Review, vol. 43, No. 4, Dec. 1982, pp. 665–674 J. Zelez, "A Diamond-Like Carbon Film".

*Primary Examiner*—Thi Dang
*Attorney, Agent, or Firm*—Sixbey, Friedman, Leedom & Ferguson

[57] ABSTRACT

An improved semiconductor device and manufacturing method for the same is described. The device is provided with an interleaved carbon pattern. The heat produced in the semi conductor device can be quickly dissipated and the undesirable temperature elevation can be prevented due to the low thermal conductivity of the carbon pattern.

27 Claims, 4 Drawing Sheets

ELECTRIC DEVICE PROVIDED WITH CARBON PATTERN STRUCTURE AND MANUFACTURING METHOD FOR THE SAME

This is a divisional application of Ser. No. 631,758, filed Dec. 21, 1990, now abandoned, which is a continuation application of Ser. No. 301,136, filed Jan. 25, 1989, now abandoned.

BACKGROUND OF THE INVENTION

The present invention relates to an electric device provided with carbon pattern structure and manufacturing method for the same.

Recently, a process for forming carbon films having a very high hardness has been developed utilizing chemical vapor reactions. An example is described in Japanese Patent Application No. sho56-146936 filed on Sep. 17, 1981. Carbon films of this type are very useful due to the their high hardness providing a smooth and corrosion-proof surface. These advantages, however, make etching become difficult on the other hand, while etching process is very important particularly in the semiconductor device manufacture.

SUMMARY OF THE INVENTION

It is an object of the present invention to provide an electric device provided with carbon pattern structure.

It is another object of the present invention to provide a method of patterning carbon films.

In order to accomplish the above and other objects and advantages, a substrate coated with a carbon film is disposed in a reaction chamber and subjected to etch. In a preferred embodiment, the etching is associated with, a chemical vapor reaction which is caused with an oxygen containing etchant gas by a high frequency electric power at 50 W to 5 KW. The carbon film is a so-called diamond like carbon film whose Vickers hardness is expected to 6500 Kgt/mm$^2$ or higher depending to the formation condition. The energy gap is not lower than 1.0 eV, preferably 1.5 to 5.5 eV. When used for thermal heads frequently subjected to rubbing action, the smooth and hard surface of the carbon film is very suitable. On the other hand, when used for integrated circuits of semiconductor devices, the low thermal conductive coefficient of the carbon film makes it possible to dissipate heat generated in the integrated circuit.

DETAILED DESCRIPTION OF THE PREFERRED EMBODIMENTS

Figure 1:
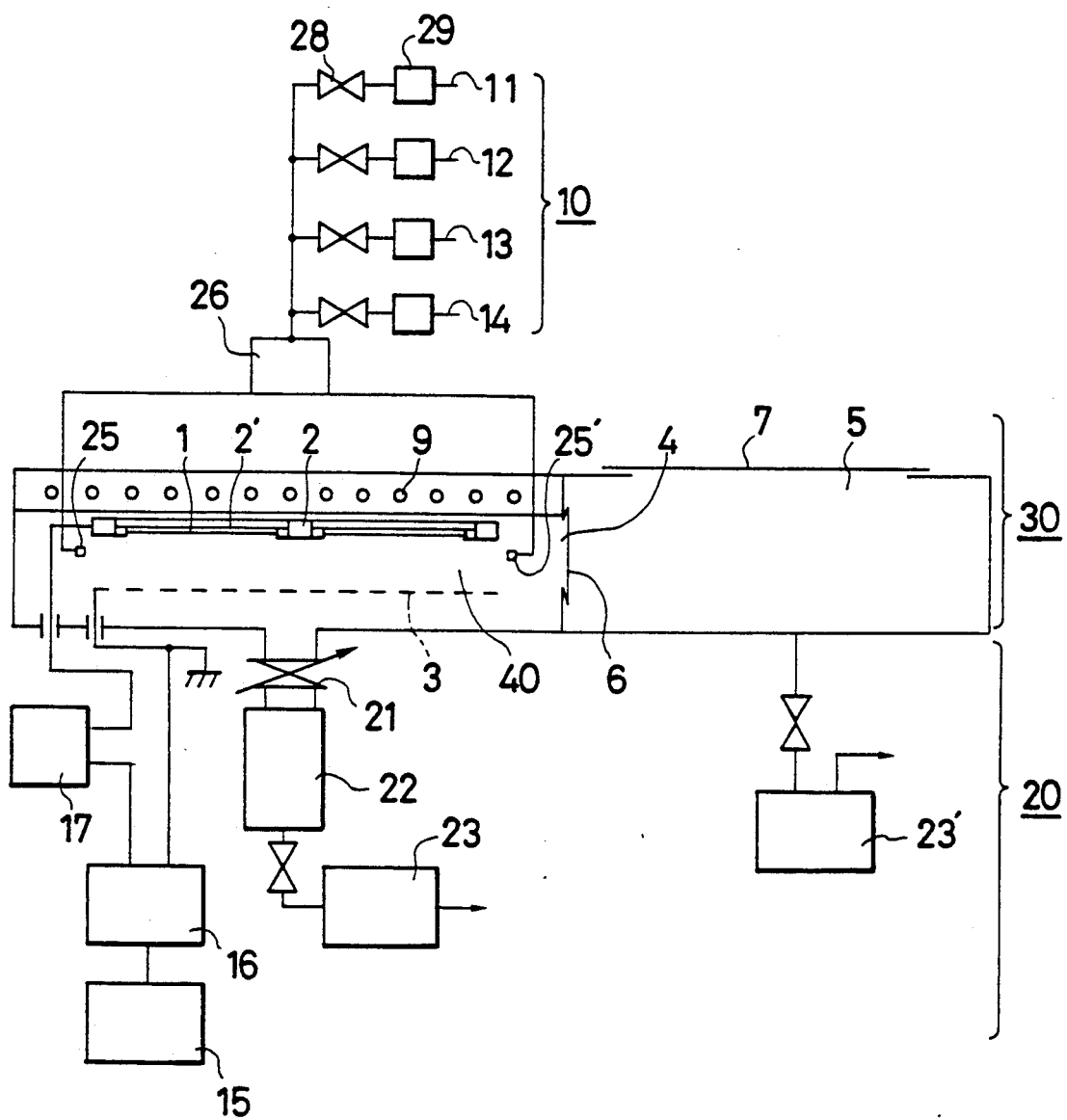
FIG. 1 is a schematic diagram showing a chemical vapor reaction apparatus.

Referring now to FIG. 1 showing a CVD apparatus, a carbon film deposition and etching method is explained in accordance with the present invention. The apparatus comprises a loading and unloading chamber 5, a reaction chamber 4 connected to the loading chamber 5 through a gate valve 6, a vacuum pump 23' provided for evacuating the loading chamber 5, a vacuum system provided for evacuating the reaction chamber 4 and consisting of a pressure control valve 21, turbo molecular pump 22 and a rotary pump 23, a gas feeding system 10 for introducing a process gas into the reaction chamber 4, a substrate holder 2 functioning also as an electrode, a mesh electrode 3, a substrate temperature controlling device 9 and a high frequency electric energy supply connected between the substrate holder 2 and the mesh electrode 3 and consisting of a high frequency power source 15, a matching transformer 16 and a bias applying device 17. Optionally, a microwave excitation device 25 may be provided in association with the gas feeding system 10. For example, the device 25 energizes the reactive gas supplied from the gas feeding system 10 by microwaves at 2.45 GHz and 200 W to 2 KW. By use of this device 25, the deposition speed and the etching speed are increased about 5 times and about 4 times respectively.

A method of depositing carbon films will be described hereinbelow. Substrates to be coated are placed in the loading chamber 5. After evacuating the loading and reaction chamber 4 and 5, the substrates 1 are transported to the reaction chamber 4 through the gate valve 6. A reactive gas is admitted to the reaction chamber 4 through the gas feeding system 10. The reactive gas includes a carbon compound gas such as $CH_4$, $C_2H_4$, $C_2H_2$, $CH_3OH$ or $C_2H_5OH$. For example, $H_2$ and $CH_4$ are inputted through the line 11 and the line 12 respectively at a same rate.

A high frequency electric power is applied to the reactive gas from the high frequency power source 15 at 50 W to 1 KW. The power is equivalent to a plasma energy of 0.03 to 3 W/cm$^2$. The electric power applied between the substrates 1 and the mesh electrode 3 is biassed by $-200$ V to $+600$ V. The actual bias potential at the substrates 1 is $-400$ to $+400$ V since a self bias voltage is spontaneously applied thereto even without the application of an external bias. When the deposition is carried out without the microwave power and a 100 to 300 V bias voltage is superimposed on the electric power, the deposition speed is 100 to 200 Å/min. When the deposition is carried out with the microwave power and a 100 to 300 V bias voltage is superimposed on the electric power, the deposition speed is 500 to 1000 Å/min. The pressure of the reactive gas is maintained at 1 to 0.01 Torr, e.g. 0.1 Torr in the reaction chamber 4. The substrate temperature is maintained at 150° to $-100°$ C. by means of the device 9. As a result, there is deposited an amorphous carbon film on the substrates 1. The carbon film consists of an amorphous carbon which may contain, depending on the deposition condition, microcrystals of 5 to 200 Å diameter. The Vickers hardness of the carbon film is not lower than 2000 Kg/mm$^2$ and the thermal conductivity is not lower than 2.5 W/cm deg, preferably 4.0 to 6.0 W/cm deg. The carbon film is characterized by C-C bonds of sp$^3$. Exhausted gas is removed through the evacuating system 21 to 23.

An electric power at 1 GHz or a higher frequency, e.g. 2.45 GHz can break C—H bonds while C—C, C=C can be broken at 0.1 to 50 MHz, e.g. 13.56 MHz. The amount of hydrogen involved in the carbon films is preferably not higher than 50 mol %. Optionally, it is useful to add impurity such as phosphorus or boron in order to fabricate carbon n-type or p-type semiconductors.

After forming a mask on the carbon film, an etchant gas is introduced into the reaction chamber 4. The etchant gas is for example $O_2$, air, $NO_2$, NO, $N_2O$, a mixture of oxygen and hydrogen, or some suitable oxygen compound. The plasma gas is generated in the same manner as in the deposition process. The substrate temperature is 100° to −100° C. during etching. The pressure of the reactive gas is 0.01 to 1 Torr. Other films may be optionally formed underlying or overlying the carbon film. The formation of the other films and the mask may be carried out in the same chamber or different chambers.

Example 1

Figure 2A:
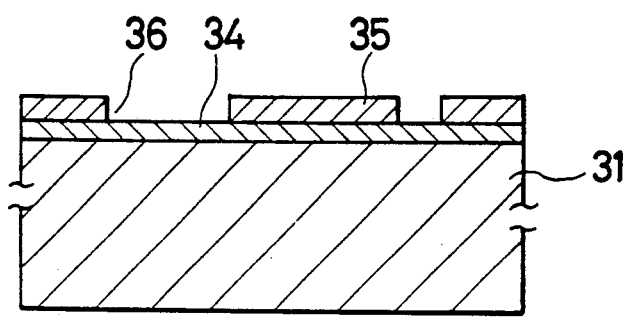
FIGS. 2(A) and 2(B) are cross sectional views showing a fabrication method of carbon patterns in accordance with the present invention.
Figure 2B:
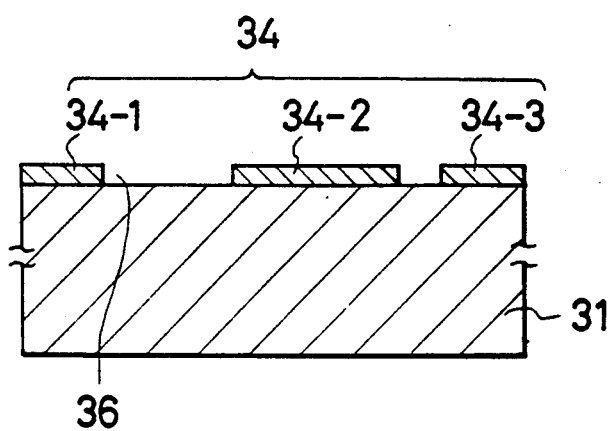

Reference made to FIGS. 2(A) and 2(B). A carbon thin film pattern was formed on substrates made of a silicon semiconductor, a glass and a ceramic. A carbon film 34 was deposited on the substrate in accordance with the above method. Some surface portions of the carbon film was coated with a mask 35 corresponding to the prescribed pattern as shown in FIG. 2(A). The mask 35 was made of silicon oxide, silicon nitride, a photoresist or the like. The etchant was $O_2$. The gas pressure was 0.1 Torr. The high frequency input power was 300 W. As a result, the carbon film was partially removed by etching at 350 Å/min. When the pressure was decreased to 0.05 Å/min, the etching rate became down to 270 Å/min. Finally, the mask was removed and a carbon pattern 34 was obtained as illustrated in FIG. 2(B).

Example 2

Figure 3A:
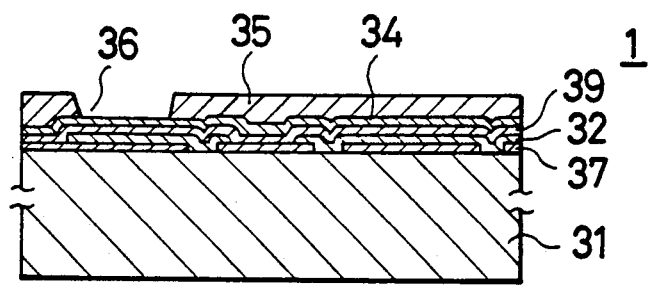
FIGS. 3(A) to 3(C) are cross sectional views showing a fabrication method of carbon patterns in accordance with the present invention.
Figure 3B:
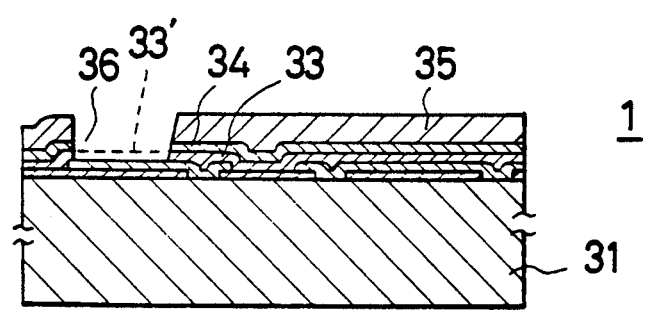
Figure 3C:
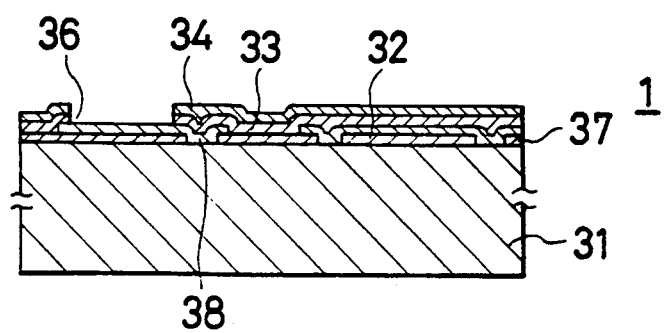

A semiconductor device using a carbon film pattern was produced. The process is explained in conjunction with FIGS. 3(A) to 3(C). The device was formed on a silicon semiconductor substrate 31. On the substrate, a silicon oxide film 37 and a superconducting ceramic film 32 were formed and patterned respectively, followed by coating of a 0.5 micron blocking film 33 which prevents the underlying film 32 from being exposed to etching action. The blocking film 33 was made of $SiO_2$. Then, a carbon film 34 was deposited on the structure to a thickness of 0.1 to 2 microns, e.g. 0.5 micron. A photoresist pattern was formed on the carbon film 34 with an opening 36. The opening 36 is a bonding pad for making contact with an IC chip. The thickness of the photoresist pattern was selected so as not to expose the underlying surface, even if it was decreased by the following etching.

Next, oxygen gas was introduced to the reaction chamber and a high frequency power was inputted at 300 W to perform etching of the carbon film 34. After completion of the etching, the photoresist 35 and a portion of the blocking film 34 at the opening was removed by etching using $NF_3$ or $SF_6$.

Alternatively, the conductive film 32 may be formed of Al, Ag or Si. The blocking film 33 may be formed of a phosphosilicate glass. The thickness of the blocking film may be 0.1 to 2 microns in general. Instead of the thick photoresist pattern, a silicon oxide pattern may be formed by coating silicon oxide film and etching the same with a photoresist. Silicon oxide does not suffer etching action from oxygen.

Example 3

Figure 4:
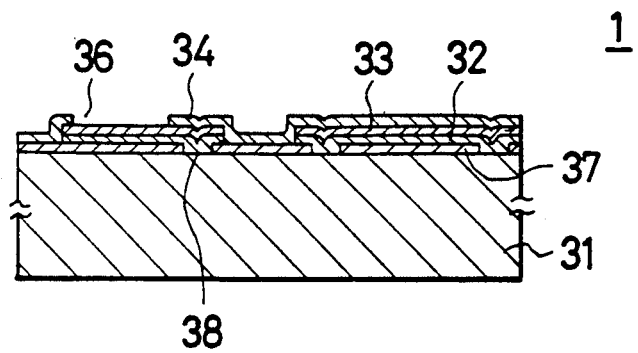
FIGS. 4, 5 and 6 are cross sectional views showing modifications of the embodiment illustrated in FIGS. 3(A) to 3(C).

This is a modified example of Example 2. In this example, the blocking film was made of a conductive material such as gold, platinum, chromium, a superconducting oxide material or silicon which was doped with impurity. The conductive pattern 32 was made of aluminum, a metal silicate or silicon which was doped with impurity. Optionally, a final coating of carbon film may be formed over the structure. In the embodiment, the blocking film 33 and the underlying pattern 32 are formed in coincident as shown in FIG. 4.

This structure is very useful when applied for IC chips. The heat concentration is reduced by virtue of the high thermal conductivity of the carbon film.

Example 4

Figure 5:
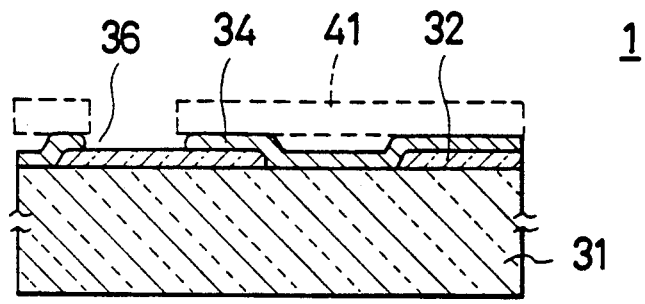

FIG. 5 is referred to. A conductive film 32 was deposited on a glass substrate or a glazed substrate and photoetched in order to produce electric wiring including pads for making contact with IC chips. A carbon film 34 was deposited to a thickness of 0.2 to 2 microns on the substrate over the pattern 32. Then, the carbon film 34 was etched with a stainless mask 41 of 50 to 500 microns thickness. This process is characterized by a decreased number of steps.

Example 5

Figure 6:
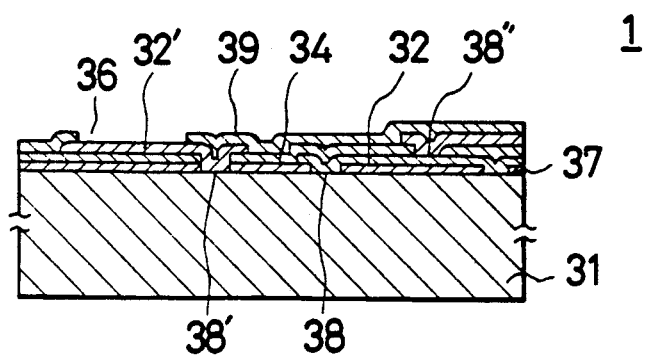

This was carried out substantially in accordance with the process of Example 2 except for the following exceptions. Reference is made to FIG. 6. In this example, a second carbon film 39 was formed and patterned as well as the carbon film pattern 34 in the same manner. Between the formations of the carbon film patterns 34 and 39, a second intervening electrode pattern 32' was formed by sputtering. The second electrode pattern 32' was prevented from making contact with other insulating films by the carbon films.

While several embodiments have been specifically described, it is to be appreciated that the present invention is not limited to the particular examples described and that modifications and variations can be made without departure from the scope of the invention as defined by tile append claims. Examples are as follow.

On the laminate pattern providing bonding pads and including the carbon films in accordance with the present invention, an IC chip is mounted and the whole structure is coated with a carbon film as a passivation film. The performance of the laminate pattern may be tested in advance of the mounting of the IC chip.

Superconducting ceraics for use in accordance with the present invention also may be prepared in consistence with the stoichiometric formulae $(A_{1-x}B_x)_yCu_zO_w$, where A is one or more elements of Group IIIa of the Periodic Table, e.g. the rare earth elements, B is one or more elements of Group IIa of the Periodic Table, e.g. alkaline earth elements, and $x=0.1-1$; $y=2.0-4.0$, preferably 2.5−3.5; $z=1.0-4.0$, preferably 1.5−3.5; $w=4.0-10.0$, preferably 6.0−8.0. Also, superconducting ceramics for use in accordance with the present invention may be prepared consistent with the stoichiometric formulae $(A_{1-x}B_x)_yCu_2O_w$, where A is one or, more elements of Group Vb of the Periodic Table such as Bi, Sb, and As; B is one or more elements of Group IIa of the Periodic Table, e.g. alkaline earth elements, and $x=0.3-1$; $y=2.0-4.0$, preferably 2.5−3.5; $z=1.0-4.0$, preferably 1.5−3.5; $w=4.0-10.0$, preferably 6.0−8.0. Examples of the latter general formulae are $Bi_4Sr_yCa_3Cu_4O_x$, $Bi_4Sr_yCa_3Cu_4O_x$, $Bi_4Sr_yCa_3Cu_4O_x$, $Bi_4Sr_yCa_3Cu_4O_x$, $Bi_4Sr_yCa_3Cu_4O_x$, $Bi_4Sr_yCa_3Cu_4O_x$ (y is around 1.5).

I claim:

1. A method of producing patterns mainly made of carbon comprising:

forming an amorphous or diamond-like carbon film having $SP^3$ carbon bonds on a substrate;

covering said carbon film with a mask made of a material resistant to an oxygen containing etchant in accordance with a prescribed pattern; and carrying out a chemical vapor etching reaction by virtue of an electric power using said oxygen containing etchant.

2. The method of claim 1 wherein said carbon film forming step comprising the steps of disposing said substrate in a reaction chamber, introducing a carbon containing reactive gas into said reaction chamber, applying an electric power to said reactive gas, and depositing a carbon film on said substrate.

3. The method of claim 2 wherein said carbon film forming step and said etching reaction carrying out step are subsequently done in the same reaction chamber.

4. The method of claim 1 wherein said chemical vapor reaction is undergone in a plasma generated from said etchant.

5. The method of claim 1 wherein said mask is made of silicon oxide, silicon nitride or an organic resin.

6. The method of claim 1 wherein said mask is made of a metal.

7. A method of forming a passivation film comprising an amorphous or diamond-like carbon film on an electronic device comprising the steps of:

forming an amorphous or diamond-like carbon film having $SP^3$ carbon bonds by a CVD method on a substrate having at least one terminal;

forming a mask on a part of said carbon film;

exposing said carbon film in an etchant gas comprising an oxygen containing material;

supplying energy to said etchant gas in order to activate said gas; and selectively etching said carbon film other than covered with said mask so that said at least one terminal is uncovered with said carbon film.

8. The method of claim 7 wherein said substrate is selected from the group consisting of a semiconductor, glass and a ceramic.

9. The method of claim 8 wherein said semiconductor has an integrated circuit formed therein.

10. The method of claim 7 wherein said at least one terminal is for making an electrical connection with an outside element.

11. The method of claim 7 wherein said oxygen containing material is selected from the group consisting of $O_2$, $NO_2$, NO, $N_2O$, a mixture of oxygen and hydrogen and air.

12. The method of claim 7 wherein said mask is made of silicon oxide, silicon nitride, a photoresist or a metal.

13. A method of forming a protective coating comprising amorphous or diamond-like carbon on an electronic device comprising:

forming an amorphous or diamond-like carbon film having $SP^3$ carbon bonds on a substrate having at least one terminal;

covering said carbon film with a mask; and selectively etching said carbon film in accordance with said mask in order to expose said at least one terminal.

14. The method of claim 13 wherein said carbon film is formed by a chemical vapor deposition method.

15. The method of claim 14 wherein said chemical vapor deposition method is a plasma CVD method.

16. The method of claim 13 wherein said substrate is a semiconductor substrate.

17. The method of claim 16 wherein said semiconductor substrate contains an integrated circuit.

18. The method of claim 13 wherein said substrate has a wiring formed thereon.

19. The method of claim 18 wherein said wiring contains lead of a metal, superconductor or semiconductor.

20. A method of forming a passivation film comprising an amorphous or diamond-like carbon film on an electronic device comprising the steps of:

forming an amorphous or diamond-like carbon film having $SP^3$ carbon bonds on an electronic device;

forming a mask on a part of said carbon film;

exposing said carbon film in an etchant gas selected from the group consisting of $NO_2$, NO, and $N_2O$;

supplying energy to said etchant gas in order to activate said gas; and selectively etching said carbon film other than covered with said mask.

21. a method of forming a passivation film comprising an amorphous or diamond-like carbon film on an electronic device comprising the steps of:

forming an amorphous or diamond-like carbon film having $SP^3$ carbon bonds on an electronic device;

forming a mask on a part of said carbon film, said mask comprising a material selected from the group consisting of silicon oxide, silicon nitride and a metal;

exposing said carbon film in an etchant gas containing at least oxygen;

supplying said energy to said etchant gas in order to activate said gas; and selecting etching said carbon film other than covered with said mask.

22. The method of claim 21 wherein said etchant is selected from the group consisting of $NO_2$, NO, and $N_2O$.

23. The method of claim 1 wherein the Vickers hardness of said carbon film is not less than 2000 $kg/mm^2$.

24. The method of claim 7 wherein the Vickers hardness of said carbon film is not less than 2000 $kg/mm^2$.

25. The method of claim 13 wherein the Vickers hardness of said carbon film is not less than 2000 $Kg/mm^2$.

26. The method of claim 20 wherein the Vickers hardness of said carbon film is not less than 2000 $Kg/mm^2$.

27. The method of claim 21 wherein the Vickers hardness of said carbon film is not less than 2000 $Kg/mm^2$.

* * * * *